United States Patent [19]

Jennings et al.

[11] Patent Number: 4,860,903
[45] Date of Patent: Aug. 29, 1989

[54] COMPONENT INSERTION MACHINE WITH RELEASABLE MAGAZINE

[75] Inventors: Lois R. Jennings, Harrah; Roger W. Long, Oklahoma City, both of Okla.

[73] Assignee: American Telephone and Telegraph Company, AT&T Technologies, Inc., Berkeley Heights, N.J.

[21] Appl. No.: 212,442

[22] Filed: Jun. 28, 1988

[51] Int. Cl.$^4$ .............................................. A47F 7/00
[52] U.S. Cl. ...................................... 211/4; 211/70.6;
211/59.1; 211/88; 292/302; 29/809; 29/740; 29/741
[58] Field of Search .................. 211/26, 70.6, 59.1, 211/59.2, 88, 94, 4; 292/302, 303; 361/415, 417, 419, 420, 429, 380; 29/809, 740, 741

[56] References Cited

U.S. PATENT DOCUMENTS

| | | | |
|---|---|---|---|
| 1,259,397 | 3/1918 | Hathaway | 292/302 |
| 1,611,649 | 12/1926 | Laurita | 211/88 X |
| 2,627,272 | 2/1953 | Segal | 292/303 X |
| 3,035,862 | 5/1962 | Phelps | 292/302 |
| 3,752,520 | 8/1973 | Sprick et al. | 292/302 X |
| 3,905,712 | 9/1975 | McConnell | 292/303 X |
| 4,422,232 | 12/1983 | Vancelette et al. | 29/741 X |
| 4,558,514 | 12/1985 | Scantom | 29/741 X |
| 4,615,089 | 10/1986 | Wright et al. | 29/741 X |

FOREIGN PATENT DOCUMENTS 494378 7/1953 Canada .................................. 29/302

Primary Examiner—Ramon S. Britts
Assistant Examiner—David G. Kolman
Attorney, Agent, or Firm—A. A. Tirva

[57] ABSTRACT

Apparatus for mounting component magazines on a component insertion machine includes a pair of pins extending from one surface of each of the magazines and a pair of corresponding openings in a plate mounted on the machine, the openings being adapted to accommodate the pins. A lever slidably mounted on the plate has openings adapted to engage recessed cylindrical surfaces forming the bottom of annular grooves in the pins thereby locking the magazine in place.

8 Claims, 3 Drawing Sheets

COMPONENT INSERTION MACHINE WITH RELEASABLE MAGAZINE

TECHNICAL FIELD

This invention relates to electronic component insertion machines and more particularly to apparatus for loading electronic components into such machines.

BACKGROUND OF THE INVENTION

Electronic component insertion machines are well known in the art and are designed to automatically insert discrete electronic components into printed circuit boards (PC boards). A typical insertion machine has a table which is movable along the x and y axes. One or more PC boards are positioned on the table and the table is then moved to position a selected portion of a PC board under an insertion head which inserts a predetermined electronic component into the board. The insertion head obtains the electronic component from one of a plurality of component magazines which usually are mounted on the frame of the machine alongside the movable table. A typical component magazine is a U-shaped container open at both ends to permit components to be inserted at one end and to be extracted at the other end.

In a typical component magazine mounting arrangement, six magazine mounting slots are available; however, because of the different magazine sizes (width of the magazines required to accommodate electronic components) usually only three or four magazines are secured to a mounting plate, which in turn is bolted to the machine frame. To change to a different size magazine or to position a magazine in a different mounting slot, the mounting plate first has to be unbolted from the machine frame before the magazine can be removed from the mounting plate. To accomplish this, the insertion machine has to be shut down, and servies of a setup man are usually required. When many small production lots are scheduled to be processed on such a component insertion machine, typically it may require many magazine changes to accmmmodate various types and sizes of electronic components and the machine down time may become quite extensive.

To reduce the machine down time and to eliminate the need for a setup man to effect the change of magazines, a new mounting arrangement has been developed which does not require removal of the mounting plate from the machine frame in order to remove one magazine and exchange it with another.

SUMMARY OF THE INVENTION

In accordance with the present invention, an arrangement for mounting a magazine on a component insertion machine includes a pair of pins extending from one surface of the magazine and a pair of openings in a mounting plate which are adapted to accommodate the pins extending from the magazine. A lever slidably mounted to the plate has openings adapted to engage the pins extending from the magazine thereby locking it in place.

DETAILED DESCRIPTION

Figure 1:
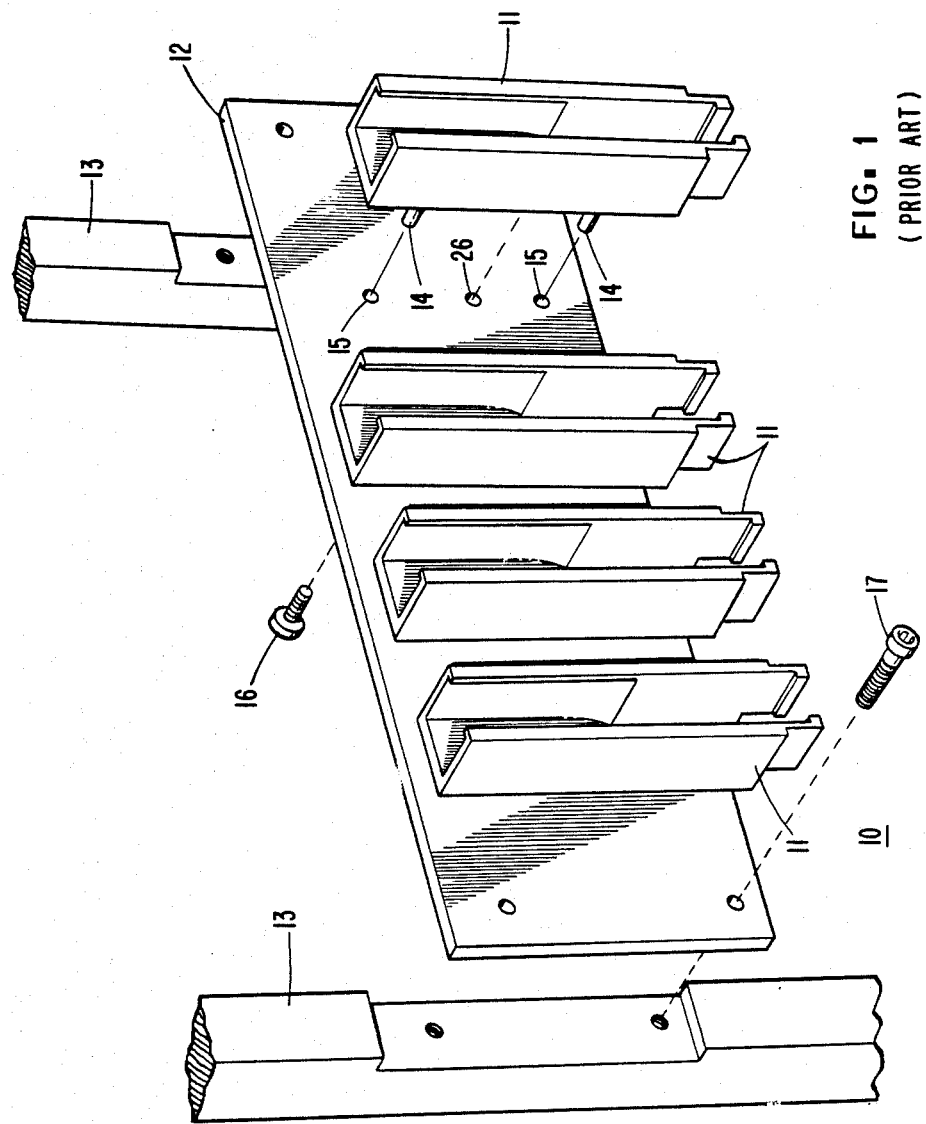
FIG. 1 is a partial perspective view of a prior art of component magazine loading arrangement.

FIG. 1 is a partial perspective view of a prior art component magazine loading arrangement 10 wherein component magazines 11 are mounted on a mounting plate 12 which in turn is mounted on a component insertion machine frame 13. Each magazine 11 has at least two dowel pins 14 which locate the magazine in openings 15 in the mounting plate 12. A screw 16 via opening 26 in the plate 12 secures the magazine 11 to the plate.

Figure 2:
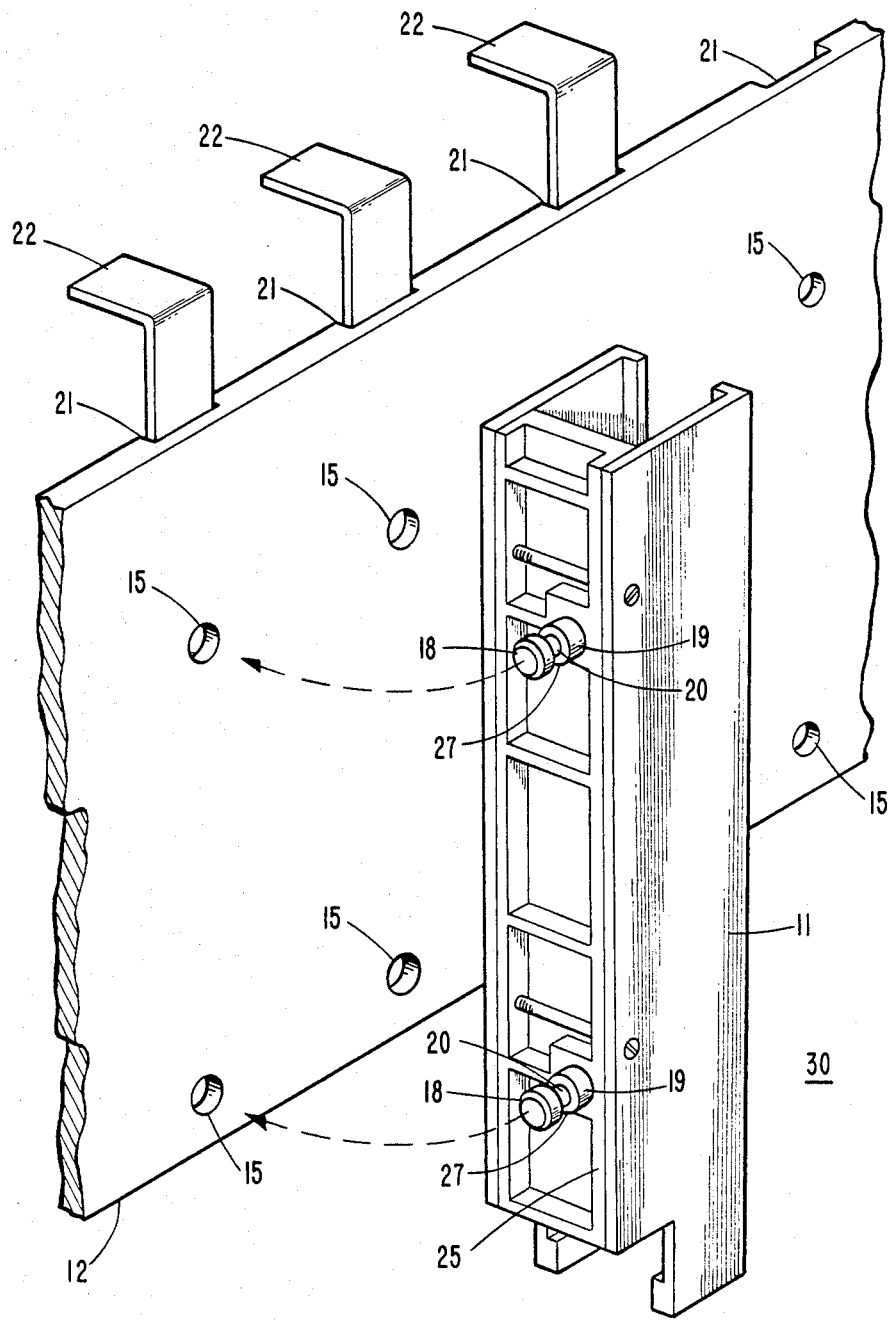
FIG. 2 is a partial perspective view of a mounting plate and a magazine releasably mounted on the mounting plate.

Referring now to FIG. 2, there is shown a partial perspective view of a component magazine 11 mounting arrangement 30 in accordance with the present invention. In the new mounting arrangement, the mounting plate 12 is secured to the machine frame 13 (not shown) in a manner similar to the one shown in FIG. 1. Each magazine 11 has in place of the dowel pins 14, two cylindrical pins 18 extending orthogonally from the back surface 25 of the magazine 11. Each pin 18 has a cylindrical bearing surface 19 located near the back surface 25 which is adapted to mate with the correspondingcircular opening 15 in the mounting plate 12 thereby accurately locating the magazine 11. The free end of each pin 18 has an annular groove 27 which includes a recessed cylindrical surface 20 forming the bottom of the groove 27, the function of which will be discussed later on.

Figure 3:
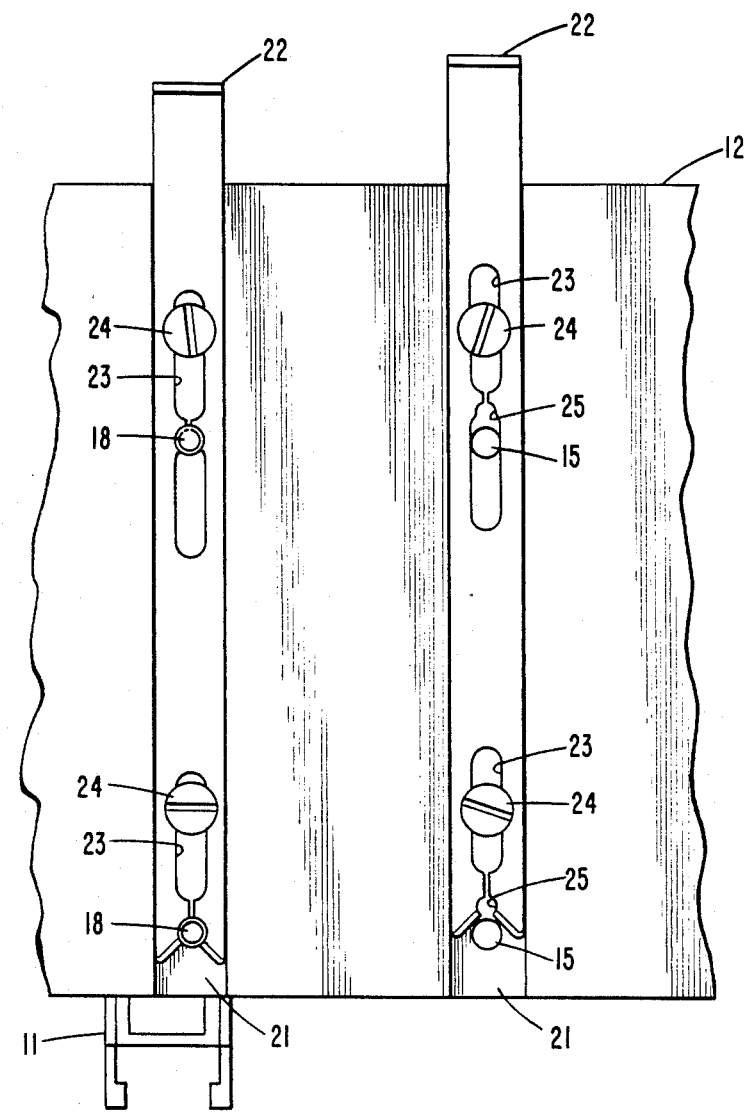
FIG. 3 is a partial back view of the mounting plate showing a lever in the locked and unlocked positions.

The mounting plate 12 has been modified by machining slots 21 in the plate surface opposite to the surface upon which the magazines are mounted. Each of the slots 21 is adapted to slidably accommodate a locking lever 22. As can be best seen in FIG. 3, the locking lever 22 has a pair of elongated openings 23 of a width to slidably accommodate a shaft (not shown) of a retaining device 24. Two of the retaining devices 24 slidably secure lever 22 to the mounting plate 12. The lever 22 further includes a pair of openings 25 each opening having a shape adapted to engage one of the recessed cylindrical surfaces 20 of the pins 18.

To install magazine 11 on the mounting plate 12, pins 18 of the magazine are inserted through the openings 15 in the plate 12 until the back surface 25 of the magazine is flush against the mounting plate 12. This action locates the cylindrical bearing surfaces 19 of the pins 18 in the openings 15 in the mounting plate 12 and extends the portion of the pin 18 having the recessed cylindrical surface 20 into the slot 21. Locking lever 22 is then moved enabling openings 25 to enage the respective recessed cylindrical surfaces 20 thereby locking the magazine 11 to the mounting plate 12. The new mounting arrangement allows magazines 11 to be quickly installed or removed from a component insertion machine without requiring removal of the mounting plate 12 from the machine frame 13.

What is claimed is:

1. A component insertion machine having apparatus mounting a component magazine on the component insertion machine, the apparatus comprising:

a pair of pins extending from one of the surfaces of the magazine;

a plate secured to said machine, the plate having a pair of openings arranged to accommodate said pins; and means for releasably locking the magazine to the plate.

2. A component insertion machine in accordance with claim 1, wherein each of said pins has a cylindrical bearing surface and the free end has a recessed cylindrical surface forming the bottom of an annular groove.

3. A component insertion machine in accordance with claim 2, wherein said locking means includes a lever slidably mounted on the plate, the lever having openings adapted to engage the recessed cylindrical surfaces of the pins.

4. A component insertion machine in accordance with claim 3, wherein said openings in the plate are circular and the cylindrical bearing surfaces of said pins are slidably accommodated in the respective openings in the plate.

5. Mounting a component magazine on the component insertion machine, the apparatus comprising:

a pair of pins extending from a surface of the magazine, each pin having a cylindrical bearing surface and the free end having a recessed cyindrical surface forming the bottom of an annular groove;

a plate secured to said machine, the plate having two circular openings arranged to let pins pass through and to slidably accommodate the cylindrical bearing surfaces of the pins allowing the magazine to be located against the plate; and a lever slidably mounted on the side of the plate opposite to the magazine, the lever having openings arranged to engage therecessed cyindrical surfaces of the pins thereby locking the magazine to the plate.

6. A component insertion machine having apparatus mounting component magazines on the machine, each magazine comprising a longitudinal channel having a substantially U-shaped cross-section, the mounting apparatus comprising:

a pair of pins extending orthogonally from the surface of the magazine forming the bottom of the U;

each pin having a cylindrical bearing surface located next to the magazne surface forming the bottom of the U, and terminating in a free end;

a plate mounted on the machine, the plate having at least a pair of circular apertures located at predetermined locations arranged to slidably accommodate the respective cylindrical bearing surfaces of the pins thereby locating and orienting the magazine in a predetermined position; and means for releasably engaging the free ends of the pins locking the magazine to the plate.

7. A component insertion machine in accordance with claim 6 wherein said means for releasably engaging includes each free end of the pin having an annular groove wherein the bottom of each groove is formed by a cylindrical surface.

8. A component insertion machine in accordance with claim 7 wherein said releasably engaging means further includes a lever slidably mounted on the side of the plate opposite to the side facing the magazine, said lever being movable to a first position whereby a pair of apertures in the mounting plate are uncovered allowing the pins of the magazine to pass through the apertures, and wherein said lever has a pair of openings shaped such when the lever is moved to a second position, said openings engage the cylindrical surfaces at the bottom of each groove.

* * * * *